US008866383B2

(12) United States Patent
Jang et al.

(10) Patent No.: US 8,866,383 B2
(45) Date of Patent: Oct. 21, 2014

(54) FLAT DISPLAY DEVICE WITH MULTILAYER SEALING LAYER HAVING OXYGEN-FREE BUFFER LAYER AND METHOD OF MANUFACTURING THE SAME

(71) Applicant: Samsung Display Co., Ltd., Yongin-si (KR)

(72) Inventors: Yong-Kyu Jang, Yongin-si (KR); Nam-Jin Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/723,024

(22) Filed: Dec. 20, 2012

(65) Prior Publication Data

US 2014/0015401 A1 Jan. 16, 2014

(30) Foreign Application Priority Data

Jul. 10, 2012 (KR) ........................ 10-2012-0075148

(51) Int. Cl.
*H01L 51/54* (2006.01)
*H05B 33/04* (2006.01)
*H05B 33/10* (2006.01)

(52) U.S. Cl.
CPC ................ *H05B 33/04* (2013.01); *H05B 33/10* (2013.01)
USPC ............................................ 313/512; 445/25

(58) Field of Classification Search
CPC ..... H01L 1/5253; H01L 1/5256; H05B 33/04
USPC .................. 257/100, 790, E33.059; 313/512; 445/25
See application file for complete search history.

(56) References Cited

U.S. PATENT DOCUMENTS

| | | | | |
|---|---|---|---|---|
| 6,194,837 | B1 * | 2/2001 | Ozawa | 315/169.1 |
| 2003/0031893 | A1 * | 2/2003 | Xie | 428/690 |
| 2003/0098647 | A1 * | 5/2003 | Silvernail et al. | 313/506 |
| 2003/0117066 | A1 * | 6/2003 | Silvernail | 313/504 |
| 2010/0253215 | A1 * | 10/2010 | Fukagawa et al. | 313/504 |
| 2011/0198627 | A1 | 8/2011 | Maindron et al. | |
| 2013/0126932 | A1 * | 5/2013 | Chen et al. | 257/99 |

FOREIGN PATENT DOCUMENTS

| | | |
|---|---|---|
| KR | 10-2005-0029790 | 3/2005 |
| KR | 10-2011-0081215 | 7/2011 |
| KR | 10-2012-0001163 | 1/2012 |

* cited by examiner

*Primary Examiner* — Nimeshkumar Patel
*Assistant Examiner* — Steven Horikoshi
(74) *Attorney, Agent, or Firm* — Christie, Parker & Hale, LLP

(57) ABSTRACT

A flat display device includes a substrate, a light-emitting diode on the substrate, and a sealing layer on the light-emitting diode, the sealing layer including at least one sealing unit that includes an organic film, an oxygen-free buffer layer on the organic film, and an inorganic film on the oxygen-free buffer layer.

17 Claims, 2 Drawing Sheets

FLAT DISPLAY DEVICE WITH MULTILAYER SEALING LAYER HAVING OXYGEN-FREE BUFFER LAYER AND METHOD OF MANUFACTURING THE SAME

CROSS-REFERENCE TO RELATED PATENT APPLICATION

This application claims priority to and the benefit of Korean Patent Application No. 10-2012-0075148, filed in the Korean Intellectual Property Office on Jul. 10, 2012, the entire contents of which are incorporated herein by reference.

BACKGROUND

1. Field

The present invention relates to a flat display device, and a method of manufacturing the same.

2. Description of the Related Art

Organic light-emitting diodes, which are self-emitting diodes, have advantages such as wide viewing angles, good contrast, quick response, high brightness, excellent driving voltage characteristics, and can provide multicolored images.

A typical organic light-emitting diode may include an anode, a cathode, and an organic layer disposed between the anode and the cathode. The organic layer may include a hole transport layer, an emission layer, an electron transport layer, and an electron injection layer. When a voltage is applied between the anode and the cathode, holes injected from the anode move to the emission layer via the hole transport layer, and electrons injected from the cathode move to the emission layer via the electron transport layer. The holes and electrons recombine in the emission layer to generate excitons. When the excitons drop from an excited state to a ground state, light is emitted. An organic light-emitting device including such organic light-emitting diodes may further include a driving transistor or a switching transistor.

The organic light-emitting diode may be deteriorated by oxygen and/or moisture. Thus, to implement a high-quality organic light-emitting device, an effective sealing element for the organic light-emitting diode is required.

SUMMARY

Aspects of embodiments of the present invention are directed to a flat display device including a sealing member for preventing or reducing oxygen and/or moisture permeation into a light-emitting diode thereby providing a longer lifetime, and a method of manufacturing the same.

According to an embodiment of the present invention, a flat display device includes a substrate, a light-emitting diode disposed on the substrate, and a sealing layer on the light-emitting diode. The sealing layer includes at least one sealing unit includes an organic film, an oxygen-free buffer layer on the organic film, and an inorganic film on the oxygen-free buffer layer.

The sealing layer may include one to ten sealing units.

The light-emitting diode may be an organic light-emitting diode including a first electrode, a second electrode opposite to the first electrode, and an organic film between the first electrode and the second electrode.

The organic film may include a cured product of at least one of an acrylate-based material, a methacrylate-based material, a vinyl-based material, an epoxy-based material, a urethane-based material, a cellulose-based material, or a silane-based materials.

The oxygen-free buffer layer may include an oxygen-free material represented by Formula 1:

$$(Ar_1)—(R_1)_p \qquad \text{Formula 1}$$

wherein, in Formula 1, $Ar_1$ is a monocyclic core or a polycyclic core that is oxygen-free; R1 is hydrogen, a halogen, a $C_1$-$C_{60}$ alkyl group, a $C_6$-$C_{60}$ aryl group, or —Si($R_{10}$)($R_{11}$)($R_{12}$); $R_{10}$ to $R_{12}$ are each independently a $C_1$-$C_{60}$ alkyl group or a $C_6$-$C_{60}$ aryl group; and p is an integer from 1 to 10.

The inorganic film may include at least one of a metal, a metal nitride, a metal oxide, or a metal oxynitride.

The sealing layer may further include at least one additional organic film and at least one additional inorganic film.

The sealing layer may include two organic films and two inorganic films.

The sealing layer may include three organic films and three inorganic films, where one organic film is between each two adjacent inorganic films.

The flat display may further include at least one of a capping layer or a protective layer between the light-emitting diode and the sealing layer.

According to another embodiment of the present invention, a method of manufacturing a flat display device includes forming a light-emitting diode on a substrate; and forming a sealing layer on the light-emitting diode, the forming of the sealing layer including forming at least one sealing unit including forming an organic film, forming an oxygen-free buffer layer on the organic film, and forming an inorganic film on the oxygen-free buffer layer.

The inorganic film may be formed by reactive sputtering or chemical vapor deposition (CVD) using oxygen gas or oxygen plasma.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

As used herein, the term "and/or" includes any and all combinations of one or more of the associated listed items. Expressions such as "at least one of," when preceding a list of elements, modify the entire list of elements and do not modify the individual elements of the list.

The present disclosure will now be described more fully with reference to the accompanying drawings, in which exemplary embodiments of the present disclosure are shown.

Figure 1:
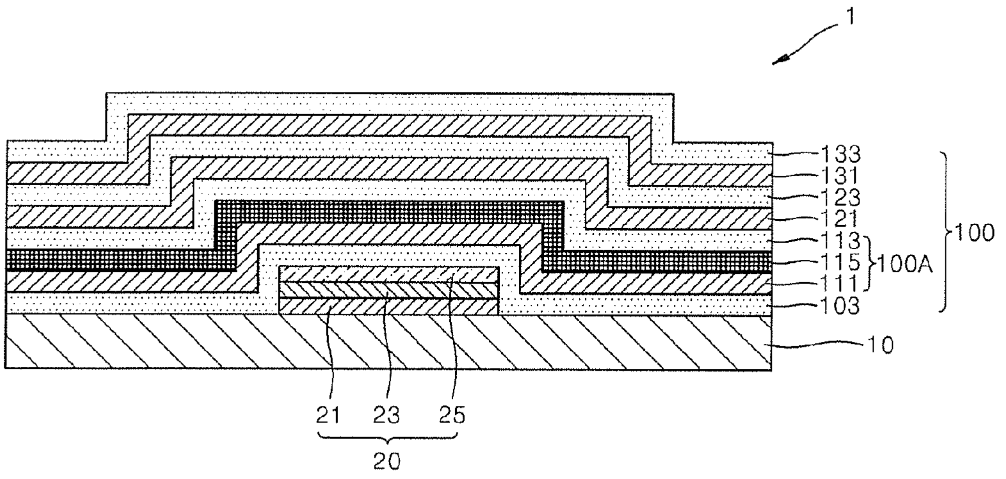
FIG. 1 is a schematic cross-sectional view a flat display device according to an embodiment of the present invention.

Referring to FIG. 1, a flat display device 1 according to an embodiment of the present invention includes a substrate 10, a light-emitting diode 20 disposed on the substrate 10, and a sealing layer 100 covering the light-emitting diode 20.

The substrate 10, which may be any substrate that is used in typical flat display devices, may be a glass substrate or a transparent plastic substrate. The substrate may have strong mechanical strength, thermal stability, transparency, surface smoothness, ease of handling, and water resistance. The substrate 10 may be formed of an inorganic material such as a transparent glass material mainly formed of $SiO_2$, or an insulating organic material such as a transparent plastic material. The insulating organic material may be, for example, selected from polyethersulphone (PES), polyacrylate (PAR), polyetherimide (PEI), polyethylene naphthalate (PEN), polyethyeleneterephthalate (PET), polyphenylene sulfide (PPS), polyarylate, polyimide, polycarbonate (PC), cellulose tri acetate (TAC), and cellulose acetate propionate (CAP), but the substrate is not limited to these materials, and any suitable material may be used.

The light-emitting diode 20 disposed on the substrate 10 may be an organic light-emitting diode including a first electrode 21, an organic layer 23, and a second electrode 25.

The first electrode 21 may be formed by depositing or sputtering a first electrode-forming material on the substrate 10. When the first electrode 21 constitutes an anode, a material having a high work function may be used as the first electrode-forming material to facilitate hole injection. The first electrode 21 may be a reflective electrode or a transmission electrode. Suitable first electrode-forming materials include transparent and conductive materials such as ITO, IZO, $SnO_2$, and ZnO. The first electrode 21 may be formed as a reflective electrode using magnesium (Mg), aluminum (Al), aluminum-lithium (Al—Li), calcium (Ca), magnesium-indium (Mg—In), magnesium-silver (Mg—Ag), or the like.

The first electrode 21 may have a single-layer structure or a multi-layer structure including at least two layers. For example, the first electrode 21 may have a three-layered structure of ITO/Ag/ITO, but the structure is not limited thereto.

The organic layer 23 may be disposed on the first electrode 21.

The organic layer 23 may include an emission layer (EML) and at least one of a hole injection layer (HIL), a hole transport layer (HTL), a buffer layer, an electron blocking layer (EBL), a hole blocking layer (HBL), an electron transport layer (ETL) and an electron injection layer (EIL). For example, the organic layer 23 may have a stacked structure including a HIL, a HTL, an EML, an ETL, and an EIL, which are stacked in this order.

First, the HIL may be formed on the first electrode 21 by vacuum deposition, spin coating, casting, Langmuir-Blodgett (LB) deposition, or the like.

The HIL may be formed of any material that is commonly used to form a HIL. Non-limiting examples of the material that can be used to form the HIL are N,N'-diphenyl-N,N'-bis-[4-(phenyl-m-tolyl-amino)-phenyl]-biphenyl-4,4'-diamine, (DNTPD), a phthalocyanine compound such as copperphthalocyanine, 4,4',4"-tris(3-methylphenylphenylamino)triphenylamine (m-MTDATA), N,N'-di(1-naphthyl)-N,N'-diphenylbenzidine (NPB), TDATA, 2-TNATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), and polyaniline/poly(4-styrenesulfonate) (PANI/PSS).

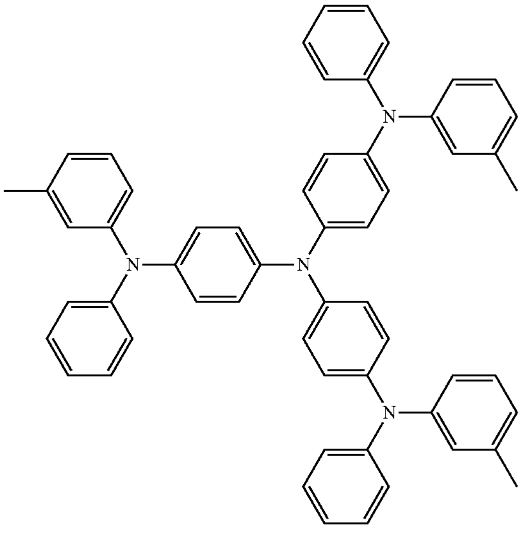

m-MTDAT

-continued

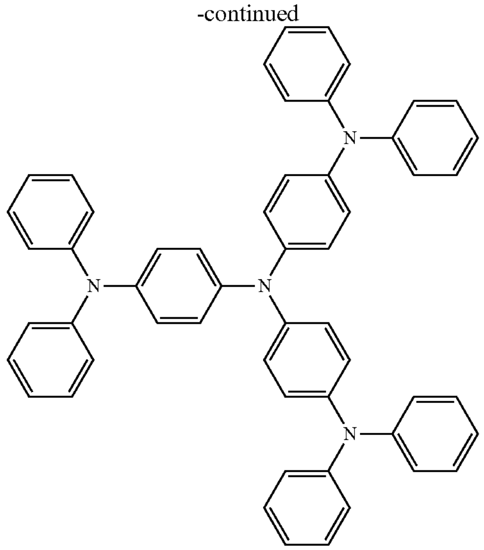

TDATA

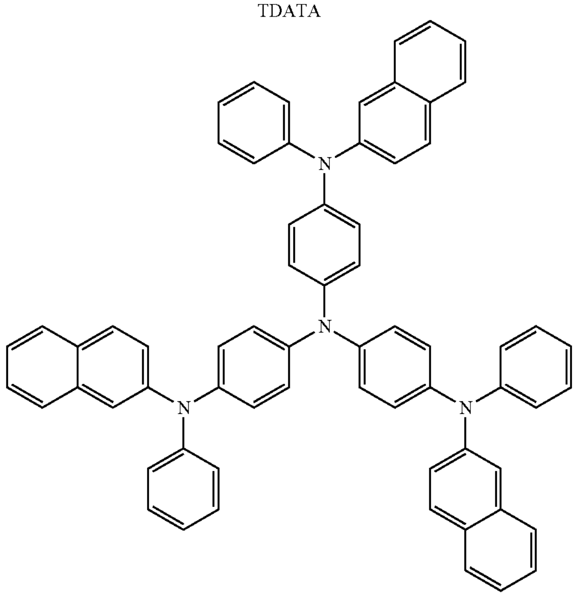

2-TNATA

Then, a HTL may be formed on the HIL by using vacuum deposition, spin coating, casting, Langmuir-Blodgett (LB) deposition, or the like.

Non-limiting examples of suitable known HTL forming materials are N,N'-bis(3-methylphenyl)-N,N'-diphenyl-[1,1-biphenyl]-4,4'-diamine (TPD), 4,4',4"-tris(N-carbazolyl) triphenylamine (TCTA), and N,N'-di(1-naphthyl)-N,N'-diphenylbenzidine) (NPB).

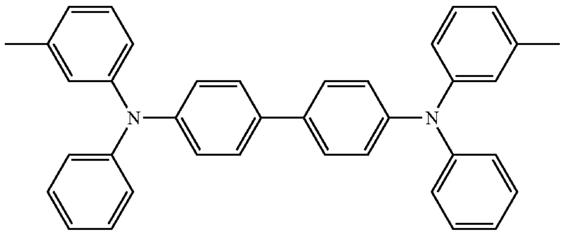

TP

-continued

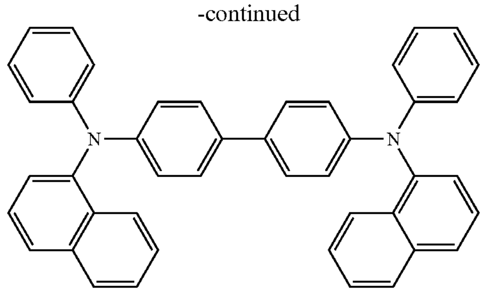

NPB

The emission layer (EML), formed on the HTL, may include a host, and a dopant. The EML may be formed on the HTL by vacuum deposition, spin coating, casting, or the like. When the EML is formed using vacuum deposition or spin coating, the deposition and coating conditions may be similar to those for the formation of the HIL, though the deposition and coating conditions may vary according to the compound that is used to form the EML. Non-limiting examples of the host material are aluminum this (8-hydroxyquinoline) ($Alq_3$), 4,4'-N,N'-dicarbazole-biphenyl (CBP), 9,10-di(naphthalene-2-yl)anthracene (ADN), 1,3,5-tris(N-phenylbenzimidazole-2-yl)benzene) (TPBI), and 3-tert-butyl-9,10-di(naphth-2-yl) anthracene (TBADN).

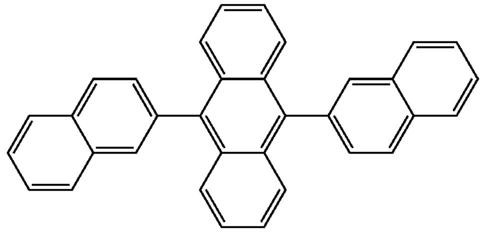

ADN

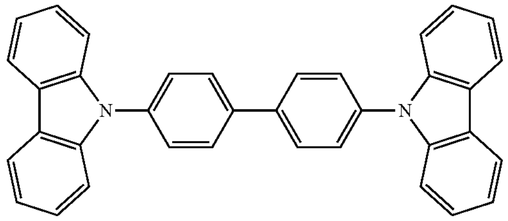

CBP

Non-limiting examples of a blue dopant are compounds represented by the following formulae.

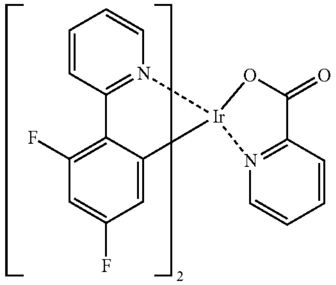

$F_2Irpic$

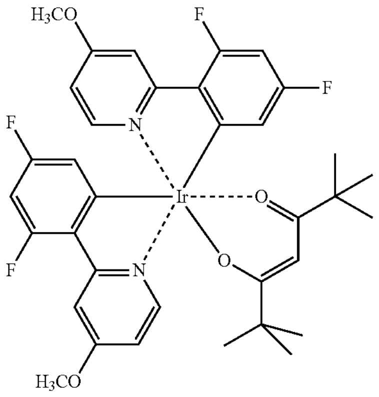

$(F_2ppy)_2Ir(tmd)$

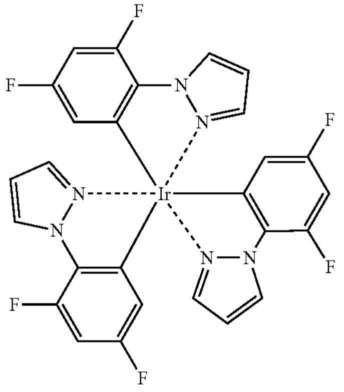

$Ir(dfppz)_3$

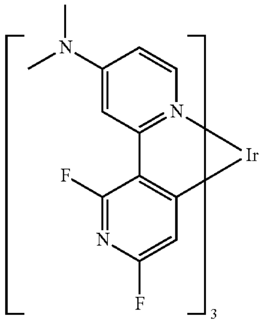

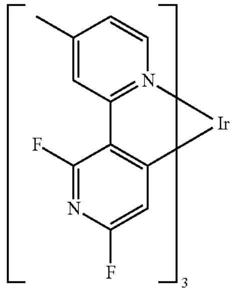

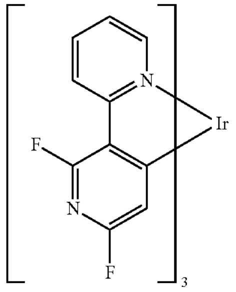

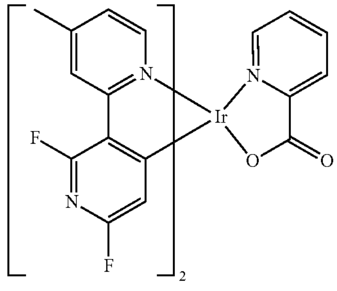

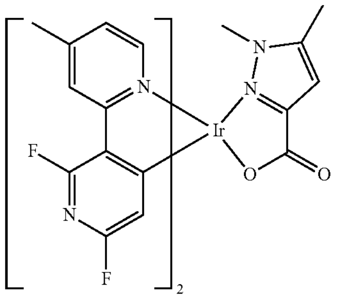

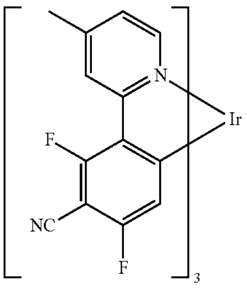

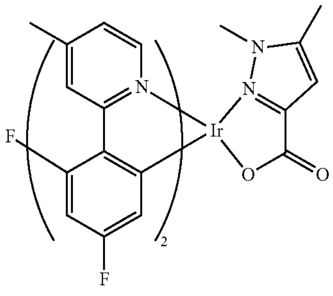

-continued
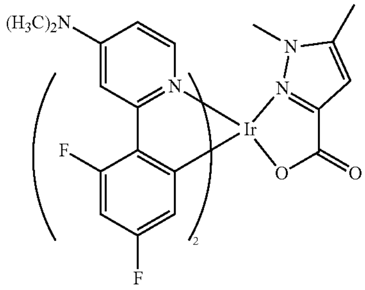
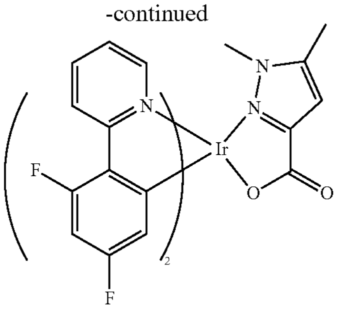
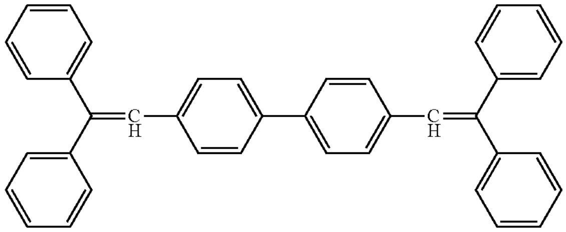
DPVBi
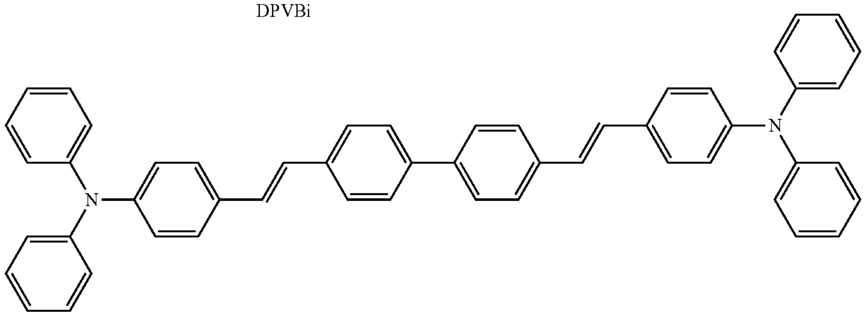
DPAVBi
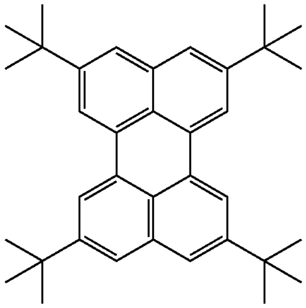
TBPe
Non-limiting examples of a red dopant are compounds represented by the following formulae.
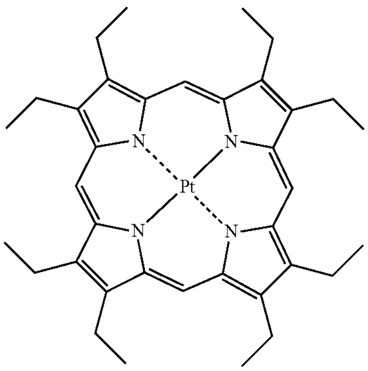
PtOEP
-continued
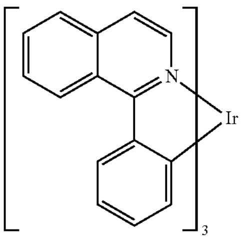
Ir(piq)$_3$
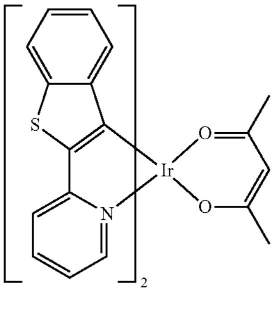
Btp$_2$Ir(acac)

-continued
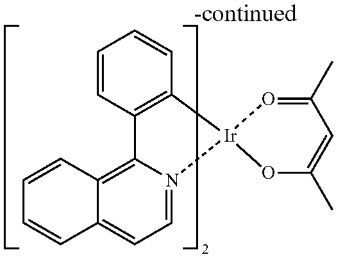
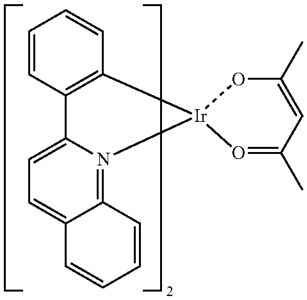
Ir(pq)2(acac)
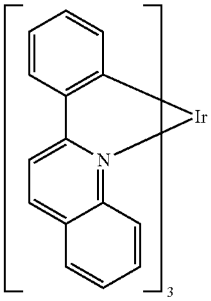
Ir(2-phq)3
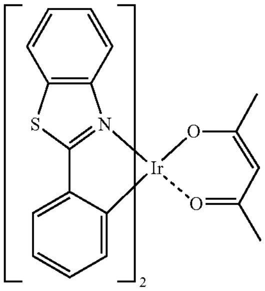
Ir(BT)2(acac)
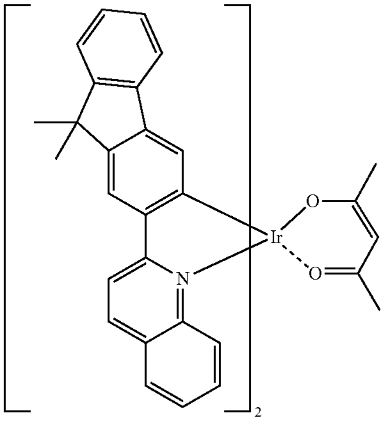
Ir(flq)2(acac)
-continued
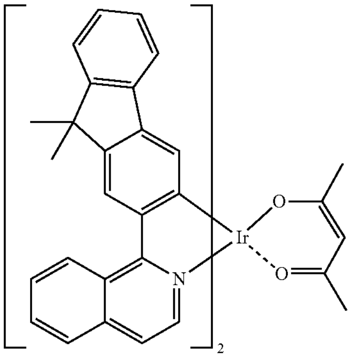
Ir(fliq)2(acac)
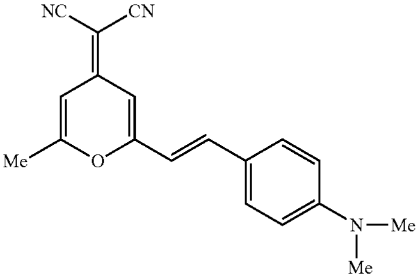
DCM
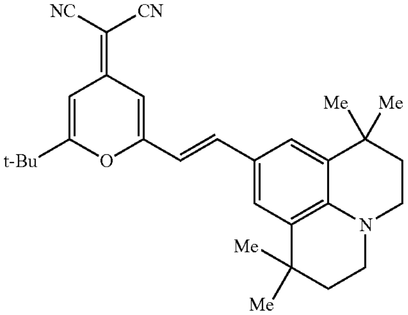
DCJTB
Non-limiting examples of a green dopant are compounds represented by the following formulae.
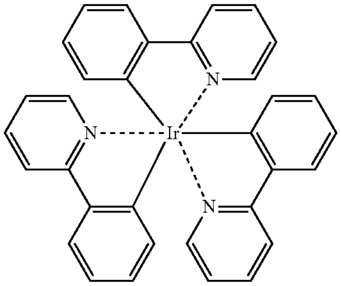
Ir(ppy)3

-continued

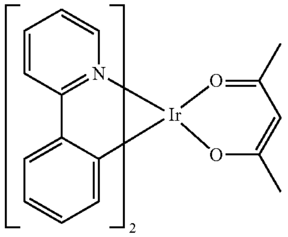

Ir(ppy)2(acac)

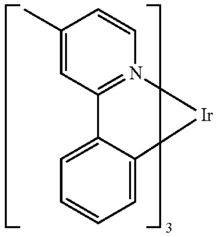

Ir(mpyp)

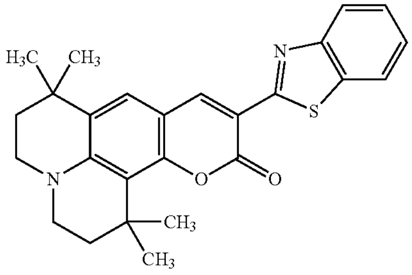

C545

Then, an ETL may be formed on the EML by vacuum deposition, spin coating, casting, or the like. When the ETL is formed using vacuum deposition or spin coating, the deposition and coating conditions may be similar to those for the formation of the HIL, though the deposition and coating conditions may vary according to a compound that is used to form the ETL. A material for forming the ETL may be any known material that can stably transport electrons injected from an electron injecting electrode (cathode). Examples of materials for forming the ETL are a quinoline derivative, such as tris(8-quinolinorate)aluminum ($Alq_3$), TAZ, BAlq, 2,9-dimethyl-4,7-diphenyl-1,10-phenanthroline (BCP), beryllium bis(benzoquinolin-10-olate) (Bebq2), 9,10-di(naphthalene-2-yl)anthracene (ADN), Compound 201, and Compound 202, but are not limited thereto.

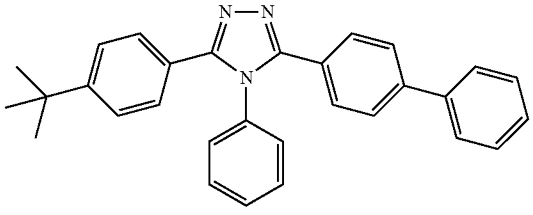

TAZ

-continued

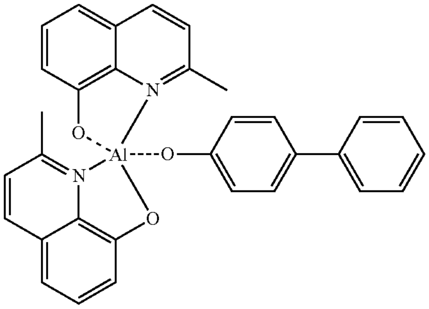

BAlq

Compound 201

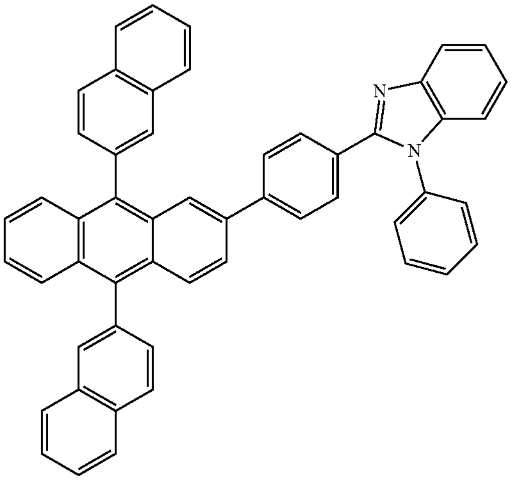

Compound 202

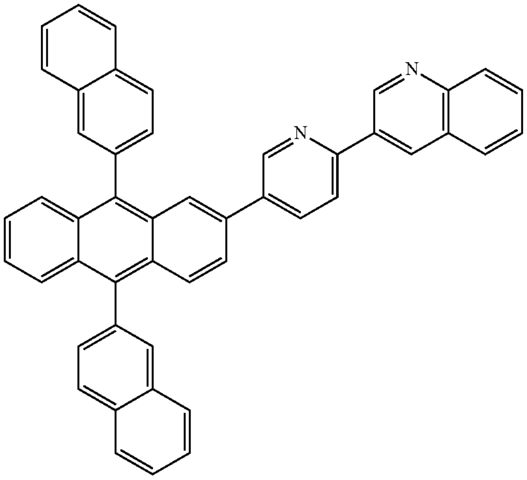

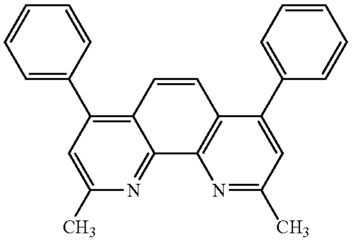

BCP

In some embodiments the ETL may further include a metal-containing material, in addition to any known electron-transporting organic compound.

The metal-containing material may include a lithium (Li) complex. Non-limiting examples of the Li complex include lithium quinolate (LiQ) or Compound 203 below:

Compound 203

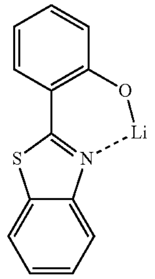

Then, an EIL, which facilitates injection of electrons from the cathode, may be formed on the ETL. Any suitable electron-injecting material may be used to form the EIL.

Examples of materials for forming the EIL include LiF, NaCl, CsF, $Li_2O$, and BaO, which are known in the art. The deposition and coating conditions for forming the EIL may be similar to those for the formation of the HIL, though the deposition and coating conditions may vary according to the material that is used to form the EIL.

The second electrode 25 is disposed on the organic layer 23. The second electrode 25 may be a cathode, which is an electron injecting electrode. A material for forming the second electrode 25 may be a metal, an alloy, an electrically conductive compound (that has a low-work function), or a mixture thereof. In this regard, the second electrode 25 may be formed of lithium (Li), magnesium (Mg), aluminum (Al), aluminum (Al)-lithium (Li), calcium (Ca), magnesium (Mg)-indium (In), magnesium (Mg)-silver (Ag), combinations thereof, or the like, and may be formed as a thin film type transmission electrode. In some embodiments, to manufacture a top-emission light-emitting diode, the transmission electrode may include indium tin oxide (ITO) and/or indium zinc oxide (IZO).

The flat display device 1 of FIG. 1 includes the sealing layer 100 on (e.g. covering) the light-emitting diode 20. The sealing layer 100 may prevent or reduce permeation of moisture and/or oxygen from an external environment into the light-emitting diode 20, so that the flat display device 1 may have long lifetime.

The sealing unit 100 may include a first sealing unit 100A. The first sealing unit 100A may have a stacked structure of a first organic film 111, a first oxygen-free buffer layer 115, and a first inorganic film 113 that are stacked in this order.

As used herein, the expression "(at least two different layers are) sequentially stacked" means that at least two different layer are disposed upon one another in a vertical direction. In this regard, a method of stacking at least two different layers is not particularly limited, and may be any of a variety of methods known in the art. Furthermore, another layer may be interposed between the at least two different layers.

The first organic film 111 may planarize a bottom surface of the first organic film 111 and may provide flexibility to the sealing layer 100. The first organic layer 111 may contain an organic material.

As used herein, the terms "organic material" means a material with at least one "carbon-hydrogen single bond."

The first organic film 111 may include a material selected from among the organic materials known as a sealing layer material. For example, the first organic film 111 may include a cured product from a light- and/or heat-curable material.

In some embodiments, the first organic film 111 may include at least one cured product of acrylate-based materials, methacrylate-based materials, vinyl-based materials, epoxy-based materials, urethane-based materials, cellulose-based materials, or silane-based materials.

Non-limiting examples of the acrylate-based material are butylacrylate, ethylhexylacrylate, and 2-hydroxyethylacrylate. Non-limiting examples of the methacrylate-based material are propyleneglycolmethacrylate and tetrahydrofurfuryl methacrylate. Non-limiting examples of the vinyl-based material are vinylacetate and N-vinylpyrrolidone. Non-limiting examples of the epoxy-based materials are cycloaliphatic epoxide, epoxy acrylate, vinyl epoxy, and epoxy silicate. A non-limiting example of the urethane-based material is urethane acrylate. A non-limiting example of the cellulose-based material is cellulose nitrate. Non-limiting examples of the silane-based material are 3-glycidoxypropyltrimethoxysilane, vinyltriethoxysilane, vinyl silane, aminopropyltrimethoxysilane, methacrylate silane, phenyl silane, and 3-tri(methoxysilyl)propyl acrylate.

The first organic film 111 may include an organic material with an oxygen-containing terminal group, such as a carboxylic acid group or an acrylate group.

The first organic film 111 may have a thickness of about 100 nm to about 10000 nm, and in some embodiments, may have a thickness of about 500 nm to about 10000 nm, and in still other embodiments, may have a thickness of about 1000 nm to about 5000 nm. When the thickness of the first organic film 111 is within these ranges, a bottom structure of the first organic film 111 may be effectively planarized.

The first oxygen-free buffer layer 115 may be disposed on the first organic film 111.

No oxygen is in the first oxygen-free buffer layer 115. For example, the first oxygen-free buffer layer 115 may be made of an oxygen-free material. The first oxygen-free buffer layer 115 may include one oxygen-free material or at least two different oxygen-free materials.

The oxygen-free material may be selected from among known materials for the HIL, the HTL, the EML (for example, a host material for an EML), or the ETL that may be used for the organic layer 23 of the light-emitting diode 20. The oxygen-free material may also be selected from among materials for a capping layer that may be disposed between the light-emitting diode 20 and the sealing layer 100, which will be described later.

In some embodiments, the first oxygen-free buffer layer 115 may include an oxygen-free material represented by Formula 1 below:

$$(Ar_1)—(R_1)_p \qquad \text{Formula 1}$$

In Formula 1 above, $Ar_1$ may be a monocyclic core or a polycyclic core that exclude oxygen.

In some embodiments, $Ar_1$ may be benzene, pentalene, indene, naphthalene, azulene, heptalene, biphenylene, indacene, acenaphthalene, fluorene, phenalene, phenanthrene, anthracene, fluoranthene, triphenylene, pyrene, chrysene, naphthacene, picene, perylene, pentacene, pentaphene, hexacene, parylene, indan, acenaphthene, cholanthrene, pentaphene, tetraphenylene, rubicene, coronene, or ovalene.

In Formula 1 above, $R_1$ may be a hydrogen atom, a halogen atom, a $C_1$-$C_{60}$ alkyl group, a $C_6$-$C_{60}$ aryl group, or —$Si(R_{10})(R_{11})(R_{12})$; and $R_{10}$ to $R_{12}$ may each independently be a $C_1$-$C_{60}$ alkyl group or a $C_6$-$C_{60}$ aryl group. In some embodiments, $R_1$ may be a hydrogen atom, —F, —Cl, a $C_1$-$C_{10}$ alkyl group, a phenyl group, a pentalenyl group, an indenyl group, a naphthalenyl group, an azulenyl group, a heptalenyl group, a biphenylenyl group, an indacenyl group, an acenaphthalenyl group, a fluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentacenyl group, a pentaphenyl group, a hexacenyl group, or —Si($R_{10}$)($R_{11}$)($R_{12}$), where $R_{10}$ to $R_{12}$ may each independently be a $C_1$-$C_{10}$ alkyl group, a phenyl group, a pentalenyl group, an indenyl group, a naphthalenyl group, an azulenyl group, a heptalenyl group, a biphenylenyl group, an indacenyl group, an acenaphthalenyl group, a fluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentacenyl group, a pentaphenyl group, or a hexacenyl group, but $R_1$ is not limited thereto.

In Formula 1, p may be an integer from 1 to 10, which indicates the number of $R_1$. If p is 2 or greater, at least two $R_1$ may be identical to or different from each other (e.g., when multiple $R_1$ groups are included, they may each be the same or different), but it is not limited thereto.

For example, the first oxygen-free buffer layer 115 may include at least one of Compounds 1 to 10 below, but the materials for the first oxygen-free buffer layer are not limited thereto.

1

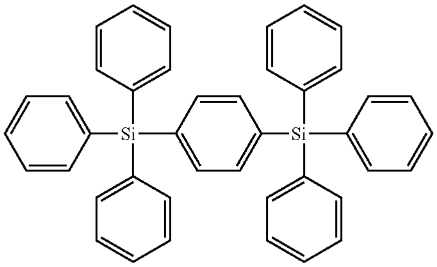

2

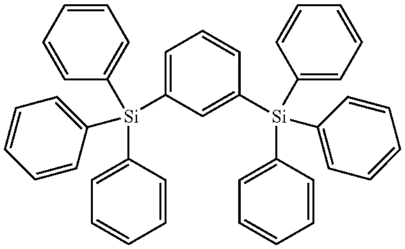

3

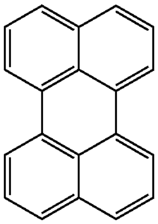

-continued

4

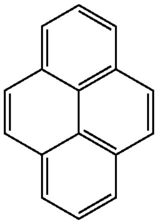

5

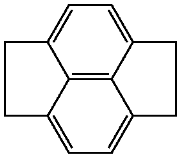

6

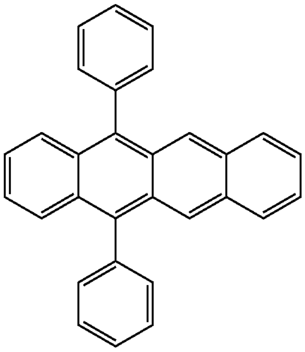

7

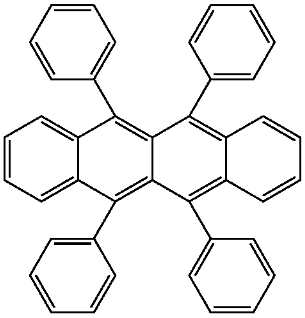

8

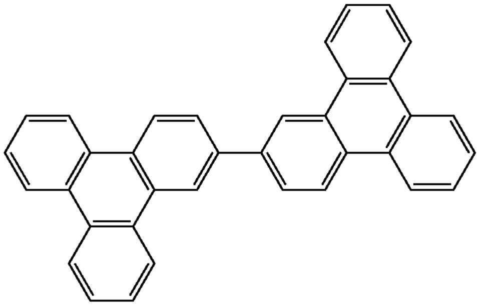

-continued

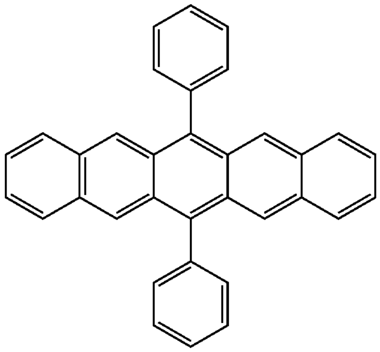

9

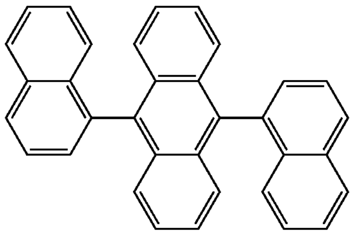

10

The first oxygen-free buffer layer 115 may have a thickness of about 10 nm to about 5000 nm, and in some embodiments, may have a thickness of about 50 nm to about 1000 nm, but the thickness of the first oxygen-free buffer layer 115 is not limited thereto. If the thickness of the first oxygen-free buffer layer 115 is within these ranges, damage of the first organic film 111 may be substantially prevented or reduced during formation of the first inorganic film 113, so that the sealing layer 100 with flexible characteristics may be implemented.

The first inorganic film 113 may be disposed on the first oxygen-free buffer layer 115.

The first inorganic film 113 may prevent or reduce permeation of moisture and/or oxygen from an external environment into the light-emitting diode 20.

The first inorganic film 113 may include a material selected from among the inorganic materials known as a sealing layer material. For example, the first inorganic film 113 may include at least one of metal, metal nitride, metal oxide, or metal oxynitride. For example, the first inorganic film 113 may include at least one of aluminum nitride, aluminum oxide, or aluminum oxynitride, but the first organic film 113 is not limited thereto. For example, the first inorganic film 113 may include at least one of $SiO_2$, SiC, SiN, SiON, $In_2O_3$, $TiO_2$, or $Al_2O_3$, but the first organic film 113 is not limited thereto.

The first inorganic film 113 may have a thickness of about 10 nm to about 5000 nm, and in some embodiments, may have a thickness of about 50 nm to about 1000 nm, but the thickness of the first inorganic film 113 is not limited thereto. When the thickness of the first inorganic film 113 is within these ranges, the sealing layer 110 may have improved sealing characteristics.

The first inorganic film 113 may be formed using sputtering, reactive sputtering, chemical vapor deposition (CVD), plasma-enhanced chemical vapor deposition (PECVD), evaporation, electron cyclotron resonance plasma-enhanced chemical vapor deposition (ECR-PECVD), physical vapor deposition, atomic-layer deposition, or the like. For example, the first inorganic film 113 may be formed using reactive sputtering or chemical vapor deposition (CVD) using oxygen gas or oxygen plasma, but the formation of the first inorganic film 113 is not limited thereto.

The first oxygen-free buffer layer 115 may prevent or reduce damage to the first organic film 111, which underlies the first inorganic film 113, during formation of the first inorganic film 113.

The first inorganic film 113 includes an inorganic material as described above, and thus may be formed by a method using relatively high-energy, for example, by plasma-enhanced chemical vapor deposition (CVD).

For example, when forming the first inorganic film 113 by CVD in an oxygen plasma, the organic material in the first organic film 111 underlying the first inorganic film 113 may be damaged (for example, may be decomposed) by oxygen ions, oxygen radicals, or UV rays generated from oxygen plasma. For example, when the first organic film 111 includes an organic material with a terminal group including an oxygen atom, such as a carboxyl group or an acrylate group, oxygen ($O_2$) and/or water ($H_2O$) may be generated from the damaged first organic film 111, and diffuse into the light-emitting diode 20. This may be a cause of deterioration of the light-emitting element 20. For example, this may cause a dark spot when the flat display device 1 is operated and/or is stored.

However, as a result of the first oxygen-free buffer layer 115 disposed on the first organic film 111, oxygen ions, oxygen radicals, or UV rays generated from the oxygen plasma used when forming the first inorganic film 113 may not reach the first organic film 111. Furthermore, since the first oxygen-free buffer layer 115 includes no oxygen, the first oxygen-free buffer layer 115 may not produce oxygen ($O_2$) and/or water ($H_2O$), even if damaged by oxygen ions, oxygen radicals, or UV rays generated from the oxygen plasma used when forming the first inorganic film 113.

Therefore, the sealing layer 100 including the first sealing unit 100A, which includes the first organic film 111, the first oxygen-free buffer layer 115, and the first inorganic film 113, may provide improved sealing characteristics for the light-emitting diode 20, so that the flat display device 1 of FIG. 1 may have long lifetime.

In addition to the above-described first sealing unit 100A, the sealing layer 100 may further include two organic films 121 and 131 and two inorganic films 123 and 133, which are alternately stacked upon one another. The two organic films 121 and 131 and the two inorganic films 123 and 133 are stacked on an upper surface of the first sealing unit 100A.

In some embodiments, as a result of the alternately stacked two organic films 121 and 131 and two inorganic films 123 and 133, the sealing layer 100 may effectively prevent permeation of oxygen and/or moisture into the light-emitting diode 20.

The sealing layer 100 may further include, in addition to the first sealing unit 100A as described above, a lower inorganic film 103 underlying the first sealing unit 100A.

Thus, the sealing layer 100 may have a stacked structure of the lower inorganic film 103, the first organic film 111, the first oxygen-free buffer layer 115, the first inorganic film 113, the second organic film 121, the second inorganic film 123, the third organic film 131, and the third inorganic film 133 that are sequentially stacked in this order.

As used herein, the expression "at least two organic films and at least two inorganic films are alternately stacked upon one another" refers to a stacked structure of alternating organic and inorganic films, such as a structure of "organic film/inorganic film/organic film . . . " or "inorganic film/organic film/inorganic film . . . ", in which either two different inorganic films or two different organic films are not stacked adjacent to each other. Another film may be interposed between the organic film and the inorganic film.

The above-description of the first organic film 111 may be referred to as a detailed description of the second organic film 121 and the third organic film 131, and the above-description of the first inorganic film 113 may be referred to as a detailed description of the second inorganic film 123, the third inorganic film 133, and the lower inorganic film 103.

The first organic film 111, the second organic film 121, and the third organic film 131 may include the same organic material, and/or may have the same thickness. In some other embodiments, the first organic film 111, the second organic film 121, and the third organic film 131 may each include different organic materials and/or may have different thicknesses.

The first inorganic film 113, the second inorganic film 123, the third inorganic film 133, and the lower inorganic film 103 may include the same inorganic material, and/or may have the same thickness. In some other embodiments, the first inorganic film 113, the second inorganic film 123, the third inorganic film 133, and the lower inorganic film 103 may each include different inorganic materials and/or may have different thicknesses.

The sealing layer 100 may have a thickness of about 1000 nm to about 80000 nm, and in some embodiments, may have a thickness of about 1560 nm to about 60000 nm, and in some other embodiments, may have a thickness of about 3300 nm to about 21000 nm. When the thickness of the sealing layer 100 is within these ranges, the sealing layer 100 may effectively prevent permeation of water and/or oxygen into the light-emitting diode 20 and have flexible characteristics.

Although not shown in FIG. 1, at least one of a capping layer or a protective layer may be further disposed between the light-emitting diode 20 and the sealing layer 100.

The capping layer may induce constructive interference of light emitted from the light-emitting diode, and thus enhance light extraction efficiency. The capping layer may be formed of a material having a relatively high refractive index. For example, the capping layer may include an organic metal complex, such as $Alq_3$, a silicon oxide, or a silicon nitride, but the material of the capping layer is not limited thereto.

The protective layer may prevent damage of the light-emitting diode 20, which may occur during the formation of the sealing layer 100. For example, the protective layer may include a silicon oxide or a silicon nitride, but the material of the protective layer is not limited thereto.

A method of manufacturing the flat display device 1 of FIG. 1 will be described below.

First, the light-emitting diode 20 is formed on the substrate 10. When the light-emitting diode 20 is an organic light-emitting diode including the first electrode 21, the organic layer 23, and the second electrode 25, the first electrode 21 and the third electrode 25 of the light-emitting diode 20 may be formed using the method as described above.

Layers constituting the organic layer 23 (for example, a HIL, a HTL, a buffer layer, an ETL, an EIL, and the like) may be formed using an arbitrary method selected from a variety of know materials, such as vacuum deposition, spin coating, casting, or Langmuir-Blodgett (LB) deposition. If the HIL is formed using vacuum deposition, the deposition conditions may vary according to the material that is used to form the HIL, and the structure and thermal characteristics of the HIL to be formed. For example, the deposition conditions may include a deposition temperature of about 100° C. to about 500° C., a degree of vacuum of about $10^{-10}$ to about $10^{-3}$ torr, and a deposition rate of about 0.01 to 100 Å/sec. If the HIL is formed using the spin-coating method, coating conditions may differ according to the target compound, the target layer structure, and thermal characteristics. In this regard, in general, the coating rate may be about 2000 rpm to about 5000 rpm, and the thermal treatment temperature may be from about 80° C. to about 200° C. at which a solvent used is removed after the coating.

Subsequently, the lower inorganic film 103 may be formed to cover the light-emitting diode 20 using sputtering, reactive sputtering, CVD, PECVD, evaporation, ECR-PECVD, physical vapor deposition, atomic-layer deposition, or the like. The thickness and material of the lower inorganic film 103 may be the same as described above.

Next, a material for forming the first organic film 111 is applied to an upper surface of the lower inorganic film 103, and cured to form the first organic film 111. For example, when the first organic film 111 includes a cured product of a curable material, the first inorganic film 111 may be formed by applying a mixture of the curable material, a solvent and a photoinitiator onto the upper surface of the lower inorganic film 103, and curing the mixture using heat and/or light. A method of applying the material for forming the first organic film onto the lower inorganic film 103 may be any of a variety of known methods, such as flash evaporation, spin coating, dip coating, inkjet printing, or the like, but the method of applying the material for forming the first organic film is not limited thereto. The curing method may be any of a variety of known methods, such as UV curing, infrared ray curing, laser curing, or the like, but the curing method is not limited thereto. The material and thickness of the first organic film 111 may be the same as described above.

Then, the first oxygen-free buffer layer 115 is formed on the first organic film 111. A method of forming the first oxygen-free buffer layer 115 may be any of a variety of known methods, for example, deposition or spin-coating, but may be vary depending on the material used therefor. The material and thickness of the first oxygen-free buffer layer 115 may be the same as described above.

Next, the first inorganic film 113 may be formed on the first oxygen-free buffer layer 115. The first inorganic film 113 may be formed using sputtering, reactive sputtering, CVD, PECVD, evaporation, ECR-PECVD, physical vapor deposition, atomic-layer deposition, or the like. For example, the first inorganic film 113 may be formed using reactive sputtering or chemical vapor deposition (CVD) using oxygen gas or oxygen plasma, but the method of forming the first inorganic film 113 is not limited thereto. The material and thickness of the first inorganic film 113 may be the same as described above.

Even when the first inorganic film 113 is formed by the method using a relatively high energy as described above, due to the underlying first oxygen-free buffer layer 115, damage of the first organic film 111, such as decomposition of the organic material in the first organic film 111, may be prevented or reduced. Even if the first oxygen-free buffer layer 115 is exposed to and damaged by the high-energy used to form the first inorganic film 113, oxygen ($O_2$) and/or water ($H_2O$) may not be generated from the first oxygen-free buffer layer 115 since the first oxygen-free buffer layer 115 does not contain oxygen.

Next, the second organic film 121, the second inorganic film 123, the third organic film 131, and the third inorganic film 133 may be sequentially formed, thereby completing the sealing layer 100. The above-described method of forming the first organic film 111 may be referred to as methods of forming the second organic film 121 and the third organic film 131. The above-described method of forming the first inorganic film 113 may be referred to as methods of forming the third inorganic film 123 and the third inorganic film 133.

In some embodiments, as a result of the first sealing unit 100A in the sealing layer 100, generation of oxygen and/or water may be effectively prevented when forming the sealing layer 100, and permeation of oxygen and/or water from an external environment into the light-emitting element 20 may also be effectively prevented.

Although not illustrated, when at least one of the capping layer and the protective layer is disposed between the light-emitting diode 20 and the sealing layer 100, the at least one of the capping layer and the protective layer may be formed on the light-emitting diode 20 before forming the sealing layer 100.

Figure 2:
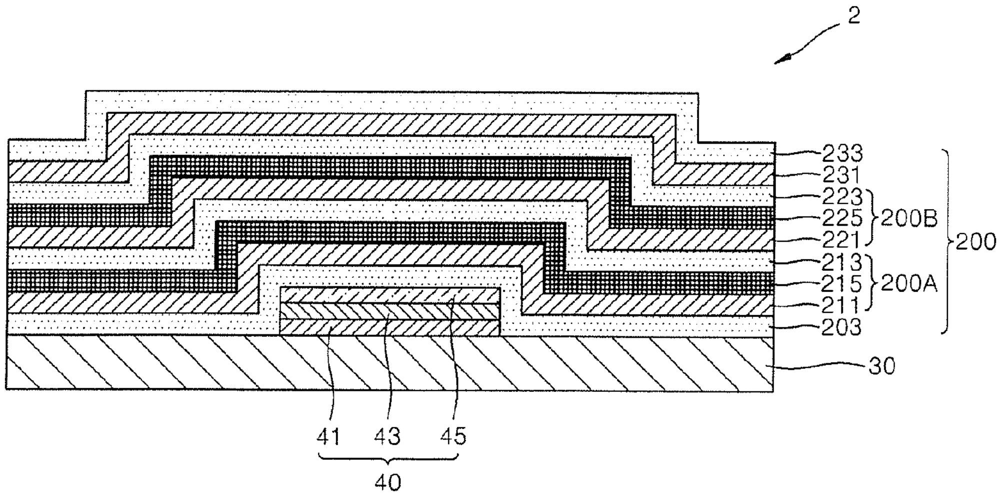
FIG. 2 is a schematic cross-sectional view of a flat display device according to another embodiment of the present invention.

Referring to FIG. 2, a flat display device 2 according to an embodiment of the present invention includes a substrate 30, a light-emitting diode 40 disposed on the substrate 30, and a sealing layer 200 covering the light-emitting diode 40. The light-emitting diode 40 may be an organic light-emitting diode including a first electrode 41, an organic layer 43, and a second electrode 45. The above-description of the substrate 10 and the light-emitting diode 20 with reference to FIG. 1 may be referred to as a detailed description of the substrate 30 and the light-emitting diode 40.

The sealing layer 200 may include a first sealing unit 200A and a second sealing unit 200B. The first sealing unit 200A may have a stacked structure of a first organic film 211, a first oxygen-free buffer layer 215, and a first inorganic film 213 that are sequentially stacked in this order. The second sealing unit 200B may have a stacked structure of a first organic film 221, a second oxygen-free buffer layer 225, and a second inorganic film 223 that are sequentially stacked in this order. The above-detailed description of the first sealing unit 100A with reference to FIG. 1 may be referred to as a detailed description of the first sealing unit 200A and the second sealing unit 200B.

The sealing layer 200 may further include one organic film 231 and one inorganic film 233, in addition to the first sealing unit 200A and the second sealing unit 200B. The sealing layer 200 may further include a lower inorganic film 203 underlying the first sealing unit 200A.

Thus, the sealing layer 200 may have a stacked structure of the lower inorganic film 203, the first organic film 211, the first oxygen-free buffer layer 215, the first inorganic film 213, the second organic film 221, the second oxygen-free buffer layer 225, the second inorganic film 223, the third organic film 231, and the third inorganic film 233 that are sequentially stacked upon one another. The above-description of the first organic film 111 with reference to FIG. 1 may be referred to as a description of the third organic film 231. The above-description of the first inorganic film 113 with reference to FIG. 1 may be referred to as descriptions of the third inorganic film 233 and the lower inorganic film 203.

In some embodiments, as a result of the two sealing units, i.e., the first sealing unit 200A and the second sealing unit 200B in the sealing layer 200, generation of oxygen and/or water may be effectively prevented when forming the sealing layer 200, and permeation of oxygen and/or water from an external environment into the light-emitting element 40 may also be effectively prevented.

Figure 3:
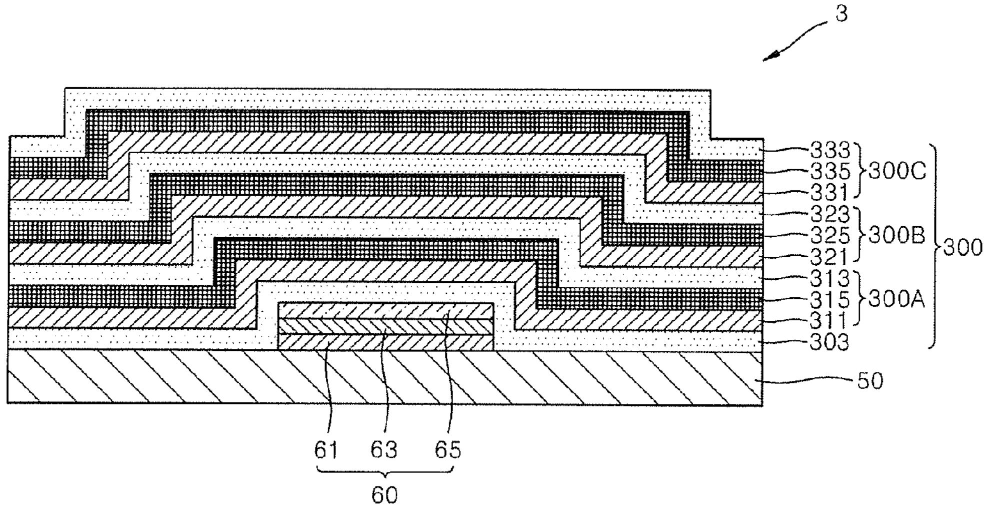
FIG. 3 is a schematic cross-sectional view of a flat display device according to another embodiment of the present invention.

Referring to FIG. 3, a flat display device 3 according to an embodiment of the present invention includes a substrate 50, a light-emitting diode 60 disposed on the substrate 50, and a sealing layer 300 covering the light-emitting diode 60. The light-emitting diode 60 may be an organic light-emitting diode including a first electrode 61, an organic layer 63, and a second electrode 65. The above-descriptions of the substrate 10 and the light-emitting diode 20 with reference to FIG. 1 may be referred to as descriptions of the substrate 50 and the light-emitting diode 60.

The sealing layer 300 may include a first sealing unit 300A, a second sealing unit 300B, and a third sealing unit 300C. The first sealing unit 300A may have a stacked structure of a first organic film 311, a first oxygen-free buffer layer 315, and a first inorganic film 313 that are sequentially stacked in this order. The second sealing unit 300B may have a stacked structure of a second organic film 321, a second oxygen-free buffer layer 325, and a second inorganic film 323 that are sequentially stacked in this order. The third sealing unit 300C may have a stacked structure of a third organic film 331, a third oxygen-free buffer layer 335, and a third inorganic film 333 that are sequentially stacked in this order. The above-description of the first sealing unit 100A with reference to FIG. 1 may be referred to as a detailed description of the first sealing unit 300A, the second sealing unit 300B, and the third sealing unit 300C.

The sealing layer 300 may further include, in addition to the first sealing unit 300A, the second sealing unit 300B, and the third sealing unit 300C, a lower inorganic film 303 underlying the first sealing unit 300A.

Thus, the sealing layer 300 may have a stacked structure of the lower inorganic film 303, the first organic film 311, the first oxygen-free buffer layer 315, the first inorganic film 313, the second organic film 321, the second oxygen-free buffer layer 325, the second inorganic film 323, the third organic film 331, the third oxygen-free buffer layer 335, and the third inorganic film 333 that are sequentially stacked upon one another. The above-description of the first inorganic film 113 with reference to FIG. 1 may be referred to as a description of the lower inorganic film 303.

In some embodiments, as a result of the three sealing units, i.e., the first sealing unit 300A, the second sealing unit 300B, and the third sealing unit 300C in the sealing layer 300, generation of oxygen and/or water may be effectively prevented when forming the sealing layer 300, and permeation of oxygen and/or water from an external environment into the light-emitting element 60 may also be effectively prevented.

As embodiments of the present inventions, the flat display devices including one sealing unit (FIG. 1), two sealing units (FIG. 2), or three sealing units (FIG. 3) are described above with reference to FIGS. 1, 2, and 3, but are not limited thereto. In some other embodiments, the flat display device may include at least four sealing units, and in some embodiments, the flat display device may include 1 to 10 sealing units. When the sealing layer of the flat display device include at least two sealing units, at least one organic film and at least one inorganic film may be interposed between the at least two sealing units. For example, the third organic film 231 and the third inorganic film 233 of FIG. 2 may be interposed between the first sealing unit 200A and the second sealing unit 200B. In some other embodiments, the inorganic films 103, 203, and 303 of FIGS. 1 to 3 may be excluded. In addition, each of the sealing units may be the same or different (e.g., the first, second, and third organic films of an embodiment may each be made of the same materials or different materials and may each have the same thickness or different thicknesses).

As described above, according to the one or more embodiments of the present invention, a sealing layer of a flat display device may substantially prevent or reduce permeation of water and/or oxygen into a light-emitting diode (for example, an organic light-emitting diode), so that the flat display device including the sealing layer may have increased lifetime.

While the present invention has been particularly shown and described with reference to exemplary embodiments thereof, it will be understood by those of ordinary skill in the art that various changes in form and details may be made therein without departing from the spirit and scope of the present invention as defined by the following claims and equivalents thereof.

What is claimed is:

1. A flat display device comprising:

a substrate;

a light-emitting diode on the substrate; and a sealing layer on the light-emitting diode, the sealing layer comprising at least one sealing unit extending beyond an edge of the light-emitting diode and comprising an organic film, an oxygen-free buffer layer on the organic film, and an inorganic film on and contacting the oxygen-free buffer layer, wherein the oxygen-free buffer layer comprises an oxygen-free material represented by Formula 1 below:

$$(Ar_1)—(R_1)_p \qquad \text{Formula 1}$$

wherein in Formula 1, $Ar_1$ is a monocyclic core or a polycyclic core that is oxygen-free;

$R_1$ is hydrogen, a halogen, a $C_1$-$C_{60}$ aryl group, or —Si$(R_{10})(R_{11})(R_{12})$;

$R_{10}$ to $R_{12}$ are each independently a $C_1$-$C_{60}$ alkyl group or a $C_6$-$C_{60}$ aryl group; and p is an integer from 1 to 10.

2. The flat display device of claim 1, wherein the sealing layer comprises one to ten sealing units.

3. The flat display device of claim 1, wherein the light-emitting diode is an organic light-emitting diode comprising a first electrode, a second electrode opposite the first electrode, and an organic layer between the first electrode and the second electrode.

4. The flat display device of claim 1, wherein the organic film comprises a cured product of at least one material selected from acrylate-based materials, methacrylate-based materials, vinyl-based materials, epoxy-based materials, urethane-based materials, cellulose-based materials, or silane-based materials.

5. The flat display device of claim 1, wherein $Ar_1$ is selected from benzene, pentalene, indene, naphthalene, azulene, heptalene, biphenylene, indacene, acenaphthalene, fluorene, phenalene, phenanthrene, anthracene, fluoranthene, triphenylene, pyrene, chrysene, naphthacene, picene, perylene, pentacene, pentaphene, hexacene, parylene, indan, acenaphthene, cholanthrene, pentaphene, tetraphenylene, rubicene, coronene, or ovalene.

6. The flat display device of claim 1, wherein $R_1$ is selected from hydrogen, —F, —Cl, a $C_1$-$C_{10}$ alkyl group, a phenyl group, a pentalenyl group, an indenyl group, a naphthalenyl group, an azulenyl group, a heptalenyl group, a biphenylenyl group, an indacenyl group, an acenaphthalenyl group, a fluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentacenyl group, a pentaphenyl group, a hexacenyl group, or —Si$(R_{10})(R_{11})(R_{12})$; and $R_{10}$ to $R_{12}$ are each independently selected from a $C_1$-$C_{10}$ alkyl group, a phenyl group, a pentalenyl group, an indenyl group, a naphthalenyl group, an azulenyl group, a heptalenyl group, a biphenylenyl group, an indacenyl group, an acenaphthalenyl group, a fluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentacenyl group, a pentaphenyl group, or a hexacenyl group.

7. The flat display device of claim 1, wherein the oxygen-free buffer layer comprises at least one of Compounds 1 to 10:

1

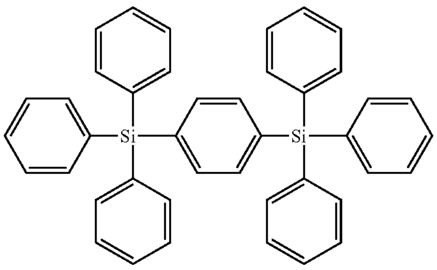

2

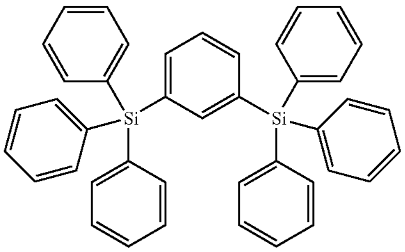

3

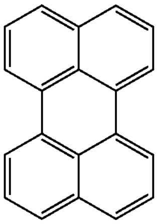

4

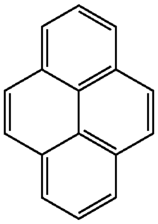

5

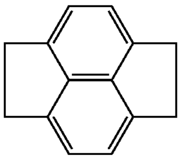

6

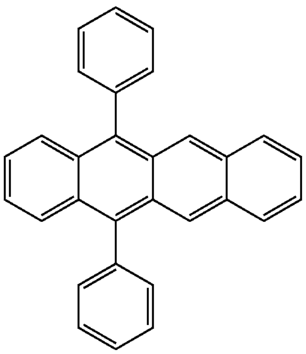

-continued

7

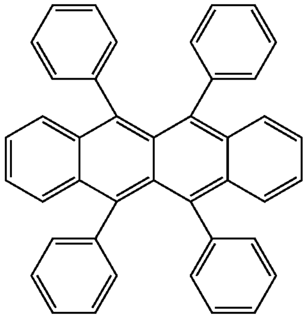

8

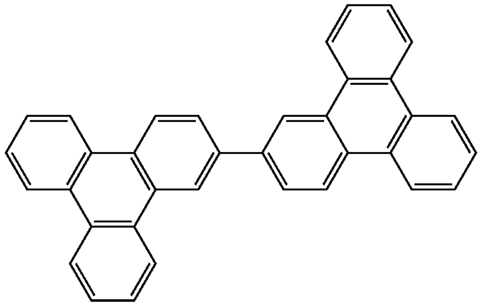

9

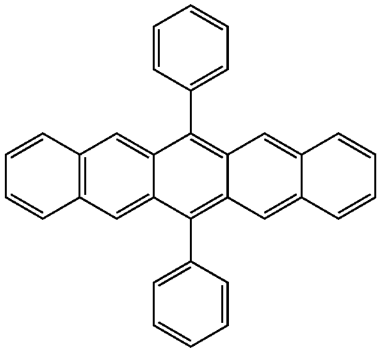

10

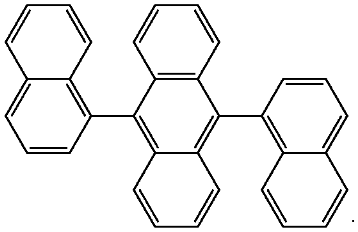

8. The flat display device of claim 1, wherein the inorganic film comprises at least one of a metal, a metal nitride, a metal oxide, or a metal oxynitride.

9. The flat display device of claim 1, wherein the sealing layer further comprises at least one additional organic film and at least one additional inorganic film.

10. The flat display device of claim 1, wherein the sealing layer comprises two organic films and two inorganic films.

11. The flat display device of claim 1, wherein the sealing layer comprises three organic films and three inorganic films, wherein one organic film is between each two adjacent inorganic films.

12. The flat display device of claim 1, further comprising at least one of a capping layer or a protective layer between the light-emitting diode and the sealing layer.

13. A method of manufacturing a flat display device, the method comprising:

forming a light-emitting diode on a substrate; and forming a sealing layer on the light-emitting diode, the forming of the sealing layer comprising forming at least one sealing unit extending beyond an edge of the light-emitting diode and comprising forming an organic film, forming an oxygen-free buffer layer on the organic film, and forming an inorganic film on and contacting the oxygen-free buffer layer, wherein the oxygen-free buffer layer comprises an oxygen-free material represented by Formula 1 below:

$$(Ar_1)—(R_1)_p \qquad \text{Formula 1}$$

wherein in Formula 1, $Ar_1$ is a monocyclic core or a polycyclic core that is oxygen-free;

$R_1$ is hydrogen, a halogen, a $C_1$-$C_{60}$ aryl group, or —Si$(R_{10})(R_{11})(R_2)$;

$R_{10}$ to $R_{12}$ are each independently a $C_1$-$C_{60}$ aryl group; and p is an integer from 1 to 10.

14. The method of claim 13, wherein the organic film is formed by curing at least one material selected from acrylate-based materials, methacrylate-based materials, vinyl-based materials, epoxy-based materials, urethane-based materials, cellulose-based materials, or silane-based materials.

15. The method of claim 13, wherein the oxygen-free buffer layer comprises at least one of Compounds 1 to 10:

1

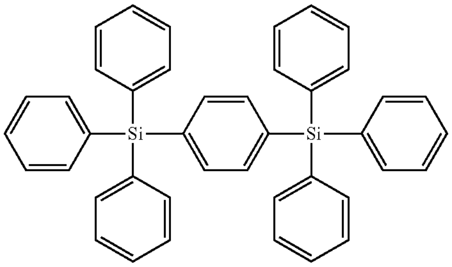

2

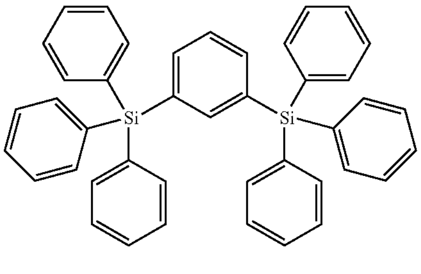

3

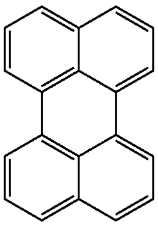

-continued
4
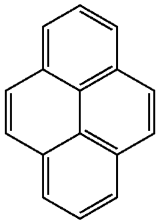
5
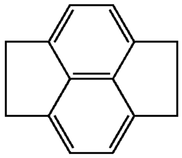
6
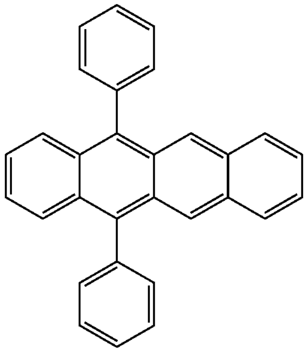
7
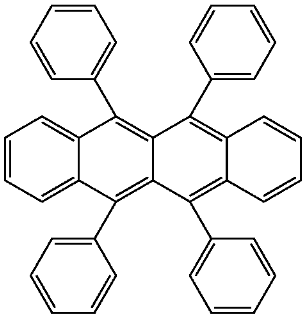
-continued
8
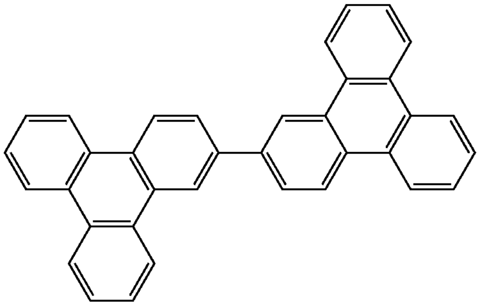
9
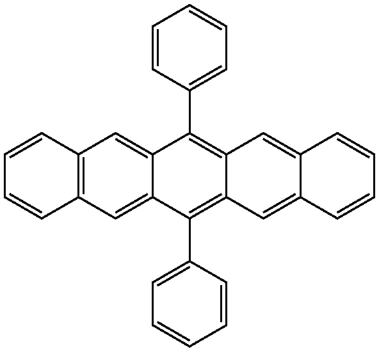
10
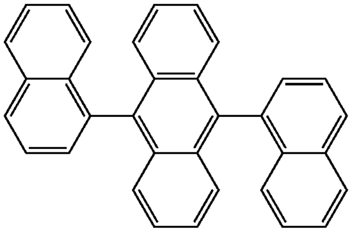
.
16. The method of claim 13, wherein the inorganic film comprises at least one of a metal, a metal nitride, a metal oxide, or a metal oxynitride.
17. The method of claim 13, wherein the inorganic film is formed by reactive sputtering or chemical vapor deposition (CVD) using oxygen gas or oxygen plasma.
* * * * *